(12) United States Patent
Syri et al.

(10) Patent No.: US 8,026,618 B2
(45) Date of Patent: Sep. 27, 2011

(54) SEMICONDUCTOR DEVICE COMPRISING A PLASTIC HOUSING, A SEMICONDUCTOR CHIP AND AN INTERPOSER INCLUDING A CONVEX OR CONCAVE LENS-SHAPE TOP SIDE FITTING SHAPE

(75) Inventors: Erich Syri, Wenzenbach (DE); Gerold Gruendler, Regensburg (DE); Juergen Hoegerl, Regensburg (DE); Thomas Killer, Hohenschambach (DE); Volker Strutz, Tegernheim (DE)

(73) Assignee: Infineon Technologies AG, Neubiberg (DE)

( * ) Notice: Subject to any disclaimer, the term of this patent is extended or adjusted under 35 U.S.C. 154(b) by 55 days.

(21) Appl. No.: 11/759,977

(22) Filed: Jun. 8, 2007

(65) Prior Publication Data
US 2008/0150124 A1 Jun. 26, 2008

Related U.S. Application Data

(63) Continuation of application No. PCT/DE2005/002017, filed on Nov. 9, 2005.

(30) Foreign Application Priority Data

Dec. 8, 2004 (DE) .......................... 10 2004 059 232

(51) Int. Cl.
*H01L 23/28* (2006.01)
(52) U.S. Cl. .......... 257/787; 257/E21.504; 257/E23.092
(58) Field of Classification Search .................. 257/95, 257/98, 99, 100, 787, 790, 794, 796, E31.117, 257/E51.02, E23.116, E33.059, 702, E21.504, 257/E23.092, E23.101, E23.117, E31.118
See application file for complete search history.

(56) References Cited

U.S. PATENT DOCUMENTS

| | | | |
|---|---|---|---|
| 5,118,924 A * | 6/1992 | Mehra et al. | 257/659 |
| 6,046,498 A | 4/2000 | Yoshikawa | |
| 6,325,638 B1 | 12/2001 | Chapin et al. | |
| 6,673,708 B1 | 1/2004 | Barber et al. | |
| 2002/0195229 A1 | 12/2002 | Hsieh et al. | |
| 2004/0036172 A1 * | 2/2004 | Azuma et al. | 257/738 |
| 2004/0080815 A1 * | 4/2004 | Muys et al. | 359/356 |
| 2004/0256727 A1 * | 12/2004 | Aoyagi et al. | 257/758 |

FOREIGN PATENT DOCUMENTS

JP 2000173947 A 6/2000

* cited by examiner

*Primary Examiner* — A. Sefer
*Assistant Examiner* — Dilinh Nguyen
(74) *Attorney, Agent, or Firm* — Edell, Shapiro & Finnan, LLC

(57) ABSTRACT

A semiconductor device includes a plastic housing and a semiconductor chip, wherein the semiconductor chip includes an active top side and a rear side. An interposer is arranged on the active top side of the semiconductor chip. At least a portion of the interposer is embedded into the plastic housing, while the top side of the interposer forms the top side of the semiconductor device. A top side fitting shape is arranged on the top side of the interposer, where the top side fitting shape has a predetermined radius of curvature that is free of plastic housing composition, and the top side fitting shape has a convex or concave lens-shaped sphere segment shape.

14 Claims, 2 Drawing Sheets

SEMICONDUCTOR DEVICE COMPRISING A PLASTIC HOUSING, A SEMICONDUCTOR CHIP AND AN INTERPOSER INCLUDING A CONVEX OR CONCAVE LENS-SHAPE TOP SIDE FITTING SHAPE

CROSS REFERENCE TO RELATED APPLICATIONS

This application is a continuation of International Application No. PCT/DE2005/002017, filed on Nov. 9, 2005, entitled "Semiconductor Device Comprising a Plastic Housing, a Semiconductor Chip and an Interposer, and Method for Producing the Same," which claims priority under 35 U.S.C. §119 to Application No. DE 102004059232.2 filed on Dec. 8, 2004, entitled "Semiconductor Device Comprising a Plastic Housing, a Semiconductor Chip and an Interposer, and Method for Producing the Same," the entire contents of which are hereby incorporated by reference.

FIELD OF THE INVENTION

The invention relates to a semiconductor device comprising a plastic housing and a semiconductor chip, and to a method for producing the same.

BACKGROUND

A semiconductor device known in the art is described in U.S. Patent Application Publication No. 2004/0036172. The known semiconductor device has a device housing with an integrated circuit comprising a substrate having mutually opposite top sides and undersides. Furthermore, the semiconductor device has a semiconductor chip having a rear side opposite its active top side. The semiconductor chip is mounted on the top side of the substrate in such a way that the rear side of the semiconductor chip faces the substrate. The plastic housing has a thermally conductive interposer arranged on the active top side of the semiconductor chip. A heat sink is arranged on the interposer, the heat sink projecting from the plastic housing by its top side.

In this case, the interposer forms a thermal coupling between the active top side of the semiconductor chip and the heat sink. Consequently, the function of the interposer is extremely limited, since it can neither be used as an intermediate wiring plate nor serve as an additional heat sink.

As is known, semiconductor chips generate heat loss. The latter is dissipated from the semiconductor chip via the housing, with the result that the semiconductor chip is prevented from heating up and thereby being able to be destroyed. The heat dissipation takes place as in the above document in that the semiconductor chip is connected via a good thermal conductor, such as a metal, a heat dissipater and/or a heat sink. The wiring substrate in the form of a printed circuit board on which the housing of the semiconductor device is fixed may already serve as a heat dissipater. In this case, the plastic housing composition performs the function of a thermal connection between the active top side of the semiconductor chip and the wiring substrate.

A further heat path passes directly through the semiconductor chip, such that the heat loss passes to the wiring substrate via the rear side of the semiconductor chip. For this purpose, the chip is generally mounted by its passive rear side onto a provided chip contact area of the wiring substrate. In the case of semiconductor devices which are constructed using BGA technology or using leadframeless technology, the heat can therefore principally be emitted in the direction of a printed circuit board in the form of the wiring substrate. The document cited above enables a third path for dissipating heat loss, in the case of which an interposer is arranged directly on the active top side of the semiconductor chip, and, for its part, it is thermally conductively connected to a heat sink.

In addition to the disadvantages already mentioned above that such an interposer can only be used to a limited extent, a further disadvantage arises in that a multiplicity of thermal transfers have to be provided in order to emit the power loss from the active top side of the semiconductor chip via the third heat path to the surroundings. However, the multiplicity of heat transfers restricts the effectiveness of the heat dissipation using the known means. Moreover, a function of the interposer as an intermediate wiring carrier, as is required for the stacking of semiconductor devices, cannot be fulfilled with the interposer known from the above document.

SUMMARY

A semiconductor device is provided comprising a plastic housing composed of a plastic housing composition which has an interposer which diverse uses in semiconductor devices, and improves mechanical and thermal properties of the semiconductor device and/or enables semiconductor devices to be stacked reliably.

The semiconductor device comprises a plastic housing composed of a plastic housing composition including a semiconductor chip having an active top side and a rear side. An interposer is arranged on the active top side of the semiconductor chip, the interposer having a top side, edge sides and an underside that is arranged opposite the top side and is fixed on the semiconductor chip. In this case, the edge sides of the interposer are at least partly embedded into the plastic housing composition, while the top side of the interposer has a convex or concave, lens-shaped topside fitting shape having a predetermined radius of curvature, the fitting shape being free of the plastic composition.

In addition, a method for producing a semiconductor device comprising a plastic housing composed of a plastic housing composition and comprising a semiconductor chip and also comprising an interposer includes the following method steps. A mold is provided with a cavity having a mold fitting shape, wherein the mold fitting shape is matched to a top side fitting shape of the interposer. Furthermore, an interposer having a top side having a convex or concave top side fitting shape having a smaller radius of curvature than the mold fitting shape is produced. Moreover, a semiconductor chip having an active top side and a rear side is produced. Finally, a circuit carrier is also produced, on which the semiconductor chip and the interposer are then fixed in such a way that firstly the semiconductor chip is applied to the circuit carrier by its rear side. Electrical connections between circuit carrier and semiconductor chip are then produced.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

DETAILED DESCRIPTION

Figure 1:
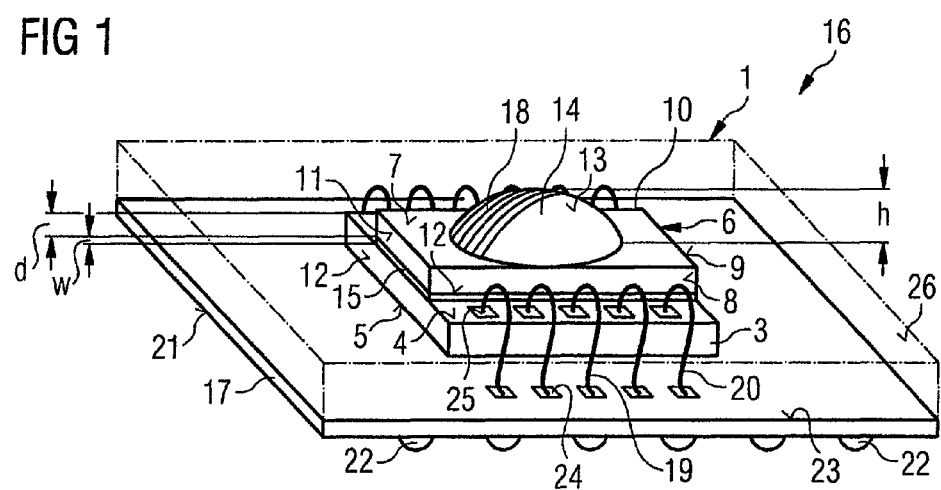
FIG. 1 shows a schematic view in perspective of an exemplary embodiment of a semiconductor device.

A semiconductor device is described herein which comprises a plastic housing composed of a plastic housing composition including a semiconductor chip having an active top side and a rear side. An interposer is arranged on the active top side of the semiconductor chip, the interposer having a top side, edge sides and an underside that is arranged opposite the top side and is fixed on the semiconductor chip. In this case, the edge sides of the interposer are at least partly embedded into the plastic housing composition, while the top side of the interposer has a convex or concave, lens-shaped topside fitting shape having a predetermined radius of curvature, the fitting shape being free of the plastic composition.

One feature provided by the semiconductor device is that the top side fitting shape, the interposer and thus the entire plastic housing can be matched in centered fashion to correspondingly preformed superordinate components and circuit carriers, such as heat sinks, stacked semiconductor devices and/or shaping tools. Furthermore, the convex or concave top side fitting shape of the interposer supports the assembly of the semiconductor device. Thus, the convex or concave top side fitting shape, during the injection molding of the plastic housing, can advantageously be brought into engagement with a corresponding cutout in the cavity of the injection-molding tool, and it is thereby possible to ensure that a semiconductor device housing is injection-molded onto the components of the semiconductor device in exact dimensions relative to the fitting shape. In this case, a convex lens-shaped top side fitting shape can be provided and a concave lens-shaped top side fitting shape can also be provided.

In the case of a lens-shaped top side fitting shape, the interposer has a thickness d and the top side fitting shape has a sphere segment having a sphere segment height h, where h<d. This condition ensures that the concave top side fitting shape does not penetrate through the interposer and does not produce a through opening.

In a further embodiment, the interposer projects from the plastic housing composition with its top side fitting shape and forms an elevation having the shape of a sphere segment having a sphere segment height h. In this case, the sphere segment height h can reach the magnitude of the sphere radius without impairing the functionality of the interposer as a centering aid. When the interposer serves as a heat sink, a convex lens-shaped top side fitting shape has the further advantage that it has a divergent lens formed above the plastic housing. The effect of such a divergent lens increases the heat radiating effect of the heat sink that is formed by the interposer.

When the interposer is used as a heat sink, it can be fixed on the active top side of the semiconductor chip by an adhesive layer. The adhesive layer has a thickness w where w<50 µm, preferably where 0.5 µm≦w≦5 µm. This has the advantage that the adhesive layer is extremely thin and so the heat transfer resistance from the high-heat-loss active top side of the semiconductor chip to the interposer remains low.

In a further embodiment, the interposer comprises a material having high thermal conductivity. A material of this type is preferably copper or a copper alloy. Such metals having a high thermal conductivity are advantageously suitable for the use of the interposer as a heat sink and also as transition to an external heat sink.

In a further embodiment, the interposer comprises a ductile material. The ductile material has the advantage that during the alignment of semiconductor device components with fitting shapes, the superordinate structures can be matched by plastic deformation without the semiconductor devices being loaded thereby. Rather, the ductile material of the interposer distributes the deformation forces that occur between the totality of the semiconductor device.

Although the interposer can be constructed from a harder metal or material, the top side fitting shape can include a coating composed of a ductile material, preferably indium. This coating, too, can ensure that the top side fitting shape can advantageously be matched to a corresponding fitting shape of the superordinate structure without overloading the components of the semiconductor device.

It is further possible for the interposer to be an intermediate wiring plate of a semiconductor device stack and to have a carrier or core plate composed of polymeric plastic, from which the convex or concave lens-shaped top side fitting shape of the interposer is also formed. In addition, an intermediate wiring plate of this type has a wiring structure with conductor track through contacts and contact pads which serve for the assembly or stacking of semiconductor devices.

In a further embodiment, a mold for producing the semiconductor device is provided. In this case, the mold includes a cavity having a mold fitting shape matched to the top side fitting shape of the semiconductor device. This provides the advantage that when the mold is closed, the alignment of the components of the semiconductor device is facilitated without the components being excessively loaded. For this purpose, the radius of curvature of the top side fitting shape prior to injection molding in a mold of this type is less than the radius of curvature of the mold fitting shape. This provides the advantage that the semiconductor device components comprising an interposer according to the invention fixed thereon and having a convex or concave lens-shaped top side fitting shape are automatically centered in the mold fitting shape. On account of the ductile coating at least in the region of the surface fitting shape, the radius of curvature of the surface fitting shape is additionally matched to the radius of curvature of the mold when the mold is closed, such that the semiconductor device that is to be removed after injection molding has a top side fitting shape having a radius of curvature that corresponds to the radius of curvature of the mold fitting shape.

A method for producing a semiconductor device comprising a plastic housing composed of a plastic housing composition and comprising a semiconductor chip and also comprising an interposer includes the following method steps. The first step involves producing a mold with a cavity having a mold fitting shape, wherein the mold fitting shape is matched to a top side fitting shape of the interposer. Furthermore, an interposer having a top side having a convex or concave top side fitting shape having a smaller radius of curvature than the mold fitting shape is produced. Moreover, a semiconductor chip having an active top side and a rear side is produced. Finally, a circuit carrier is also produced, on which the semiconductor chip and the interposer are then fixed in such a way that firstly the semiconductor chip is applied to the circuit carrier by its rear side. Electrical connections between circuit carrier and semiconductor chip are then produced.

This is followed by the application of the interposer to the active top side of the semiconductor chip by its underside. The circuit carrier is then introduced into the preformed and prepared mold with plastic deformation of the top side fitting shape and with matching of the radii of curvature of mold fitting shape and top side fitting shape to the mold. The injection molding of the plastic housing can then be effected and, finally, after the injection molding, the semiconductor device can be removed from the injection mold.

One advantage of this method is that deviations from a plane-parallel stacked construction comprising circuit carrier, semiconductor chip and interposer can be compensated for by the surface fitting shape without mechanically local peak forces that jeopardize the semiconductor chip and/or the circuit carrier occurring during the assembly of the mold. This holds true particularly for thinned semiconductor chips, which require pressure forces to be distributed as uniformly as possible over the thinned semiconductor chip when the mold is brought together. Furthermore, the above method has the further advantage that the interposer includes a ductile material, in particular in the region of the top side fitting shape. Not only is the ductile material able to be matched to the radius of curvature of the mold as a result of plastic deformation, but it also thereby simultaneously distributes the alignment forces uniformly over the entire active top side of the semiconductor chip, thereby reducing the risk of fracture during the injection molding of such thinned semiconductor chips. Furthermore, the plastic deformation of the top side fitting shape results in an intimate sealing between mold fitting shape and top side fitting shape, such that the top side fitting shape advantageously remains free of plastic residues.

In addition, a panel can be produced comprising semiconductor device positions arranged in rows and columns, where the device positions are produced in the manner described above. During the application of the plastic housing composition, however, in a departure from the above method, a common circuit carrier having the semiconductor device positions is encapsulated with a plastic housing composition to form a composite plate. This composite plate is finally separated into individual semiconductor devices.

This method variant has the advantage that the production costs are reduced and many of the necessary steps can be carried out simultaneously on a common circuit carrier. Moreover, advantages are afforded to the effect that whilst still on the circuit carrier the functionality of the individual semiconductor devices can be tested prior to encapsulation with a plastic housing composition.

In an exemplary embodiment, a metal having greater hardness than the material of the interposer is used for producing the mold. This greater hardness ensures that the mold fitting shape with its somewhat larger radius of curvature is transferred to the top side fitting shape of the semiconductor device with plastic deformation when the mold has closed.

In order to produce the interposer having a top side having a concave top side fitting shape composed of ductile material, firstly a metal plate or a core plate composed of plastic is provided, into which lens-shaped depressions are introduced, which are subsequently coated with a ductile material.

This method has the advantage that the entire interposer does not have to be produced from a ductile material from the outset in order to ensure that the top side fitting shape is matched to the mold. Rather, the interposer can have materials correspondingly adapted to its function, for example as a heat sink or as an intermediate wiring carrier, and the coating of the surface fitting shape with a ductile material can be utilized particularly during the injection molding of the housing in a matched mold.

In producing the interposer having a top side having a convex top side fitting shape composed of ductile material, a metal plate or a core plate composed of plastic can be provided, to which lens-shaped elevations composed of ductile material are applied. The lens-shaped elevations can be produced by corresponding embossing technology on a base plate, the base plate subsequently being separated to form corresponding interposers.

Such embossing technology can also be useful when interposers with a concave cutout are to be produced. In this case, the concave surface fitting shapes are introduced into the base plate and the base plate is subsequently separated into individual interposers.

In producing electrical connections between circuit carrier and semiconductor chip, bonding wires can be fitted between corresponding contact areas on the active top side of the semiconductor chip and contact pads on the top side of the circuit carrier.

A number of advantages are provided by the methods and corresponding devices described above including, without limitation, a possible tilt of the semiconductor chip and/or of the interposer with respect to the perpendicularity of the mold tool is taken up by the rounded surfaces of the mold fitting shape and of the top side fitting shape without introducing further pressure peaks into the semiconductor chip. This reduces in particular the risk of fracture of thinned semiconductor chips.

The existing differences in the Z direction, that is to say vertically with respect to the top side of the semiconductor device between mold tool and the semiconductor chip construction comprising circuit carrier, semiconductor chip and interposer are taken up by plastic deformation by the ductile material used for coating the top side fitting shape or for the entire interposer, whereby at the contact line of the radius of curvature of the surface fitting shape, the surface is pressed in at this contact.

A metallic surface is exposed at the top side of the housing and, when the interposer is used as a heat sink, can radiate heat in particular through a divergent lens function.

Exemplary embodiments are now described in greater detail with respect to the figures.

FIG. 1 shows a schematic perspective diagram of a semiconductor device 16. The semiconductor device 16 has a semiconductor housing 1 composed of a plastic housing composition 2, the outer contour of which is illustrated by broken lines in this schematic diagram in order to make it possible to show the components of the semiconductor device that are arranged in the plastic housing composition 2 (i.e., the plastic housing composition is not transparent per se). The plastic housing composition 2 is applied to a circuit carrier 17. The circuit carrier 17 comprises a wiring plate having external contacts 22 on its underside 21. A semiconductor chip 3 is fixed by its rear side 5 in the center of the top side 23 of the circuit carrier 17, while contact pads 24 are arranged on the edge regions of the top side 23, the contact pads being connected to a wiring structure of the wiring substrate.

The semiconductor chip 3 includes contact areas 25 on its active top side 4. The contact areas 25 are electrically connected to the contact pads 24 of the circuit carrier 17 via electrical connections 19 composed of bonding wires 20.

In so far as the active top side 4 of the semiconductor chip 3 is not occupied by contact areas 25, it is covered by an interposer 6. The interposer 6 is connected to the active top side 4 of the semiconductor device 3 by its underside 12 by an adhesive layer 15 having a thickness w. In this embodiment of the invention, the adhesive thickness w is 0.5 µm thick, thereby ensuring a heat transfer with low heat transfer resistance from the semiconductor chip 3 to the interposer 6. The interposer 6 has a thickness d and is embedded into the plastic composition 2 of the plastic housing 1 by its edge sides 8, 9, 10 and 11. Moreover, the interposer 6 has a top side 7 having a top side fitting shape 13.

The top side fitting shape 13 has the shape of a sphere segment 14 having a sphere segment height h with which the top side fitting shape 13 projects beyond the top side 26 of the plastic housing 1. This top side fitting shape in the form of a convex divergent lens is capable of emitting the heat loss that arises on the active top side 4 of the semiconductor device 3 during operation of the semiconductor device 3 to the surroundings like a divergent lens. Further advantages and details regarding the structure of the top side fitting shape 13 have been described above.

Figure 2:
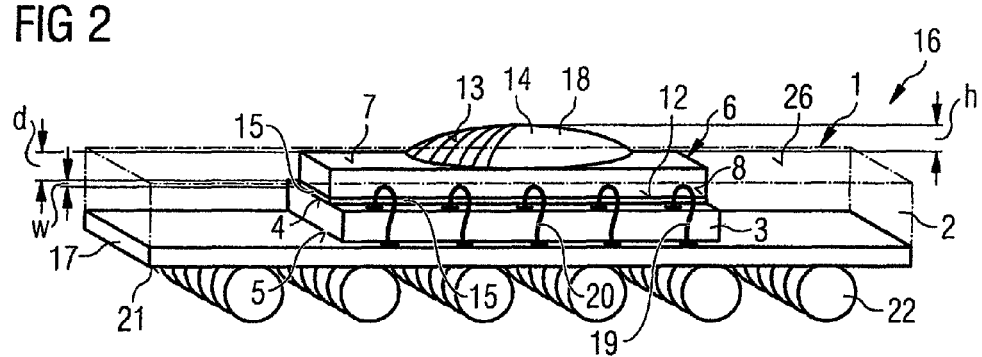
FIG. 2 shows another perspective view of the semiconductor device of FIG. 1.

FIG. 2 shows the semiconductor device from FIG. 1 at a shallower perspective angle. From the shallower perspective angle or view, it can be seen that the top side fitting shape 13 forms an elevation 18 beyond the top side 26 of the plastic housing 1. Furthermore, the shallower angle illustrates that the external contacts 22 are arranged in rows on the underside 21 of the circuit carrier 17 and distributed uniformly over the underside 21. Such external contacts 22 can be connected to a wiring structure on the top side of the carrier circuit 17 via through contacts through the circuit carrier 17, the wiring structure being connected to the contact pads.

Figure 3:
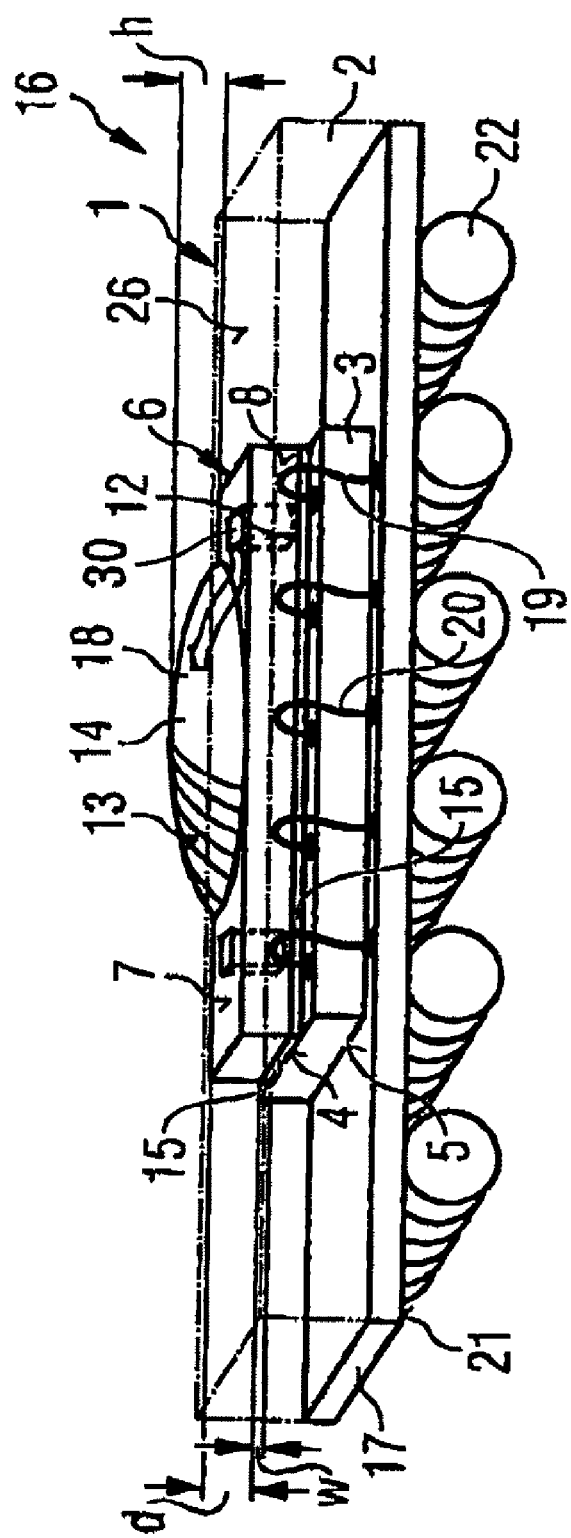
FIG. 3 shows a perspective view of the semiconductor device of FIG. 1, in which the interposer includes wiring structure and conductor tracks.

FIG. 3 shows the semiconductor device of FIGS. 1 and 2, where the interposer 6 is configured as an intermediate wiring plate including a carrier or core plate composed of polymeric plastic, from which the top side fitting shape 13 is formed and an intermediate wiring plate including a wiring structure with conductor track through contacts and contact pads 30.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed:

1. A device comprising:
    a plastic housing comprising a plastic housing composition;
    a chip including an active top side and a rear side; and
    an interposer including a top side, edge sides and an underside opposing the top side, wherein the underside is secured on the active top side of the semiconductor chip, the edge sides are at least partially embedded into the plastic housing composition, the top side of the interposer includes a convex or concave lens-shaped top side fitting shape having a predetermined radius of curvature, at least part of the fitting shape being outside and not embedded within the plastic housing composition, and at least the convex or concave lens-shaped top side fitting shape of the interposer includes a coating of a ductile material, wherein the interposer comprises a thermally conductive metal.

2. The device of claim 1, wherein the chip comprises a semiconductor chip.

3. The device of claim 1, wherein the interposer has a thickness d and the top side fitting shape has the shape of a segment of a sphere with a sphere segment height h, where $h<d$.

4. The device of claim 1, wherein the top side fitting shape of the interposer projects from the plastic housing composition.

5. The device of claim 1, wherein the interposer comprises an intermediate wiring plate of a semiconductor chip stack and includes a core plate comprising a polymeric plastic, the core plate including a wiring structure with conductor tracks.

6. The device of claim 1, wherein the thermally conductive metal comprises copper or a copper alloy.

7. The device of claim 1, wherein the interposer comprises a heat sink.

8. The device of claim 1, wherein the interposer is secured to the active top side of the chip via an adhesive layer.

9. The device of claim 8, wherein the adhesive layer has a thickness that is less than 50 µm.

10. The device of claim 8, wherein the adhesive layer has a thickness from 0.5 µm to 5 µm.

11. A mold for producing the device of claim 1, wherein the mold includes a cavity conforming to the top side fitting shape of the device.

12. The device of claim 1, wherein the convex or concave lens-shaped top side fitting shape comprises the thermally conductive metal.

13. The device of claim 1, wherein the convex or concave lens-shaped top side fitting shape comprises a metal plate or a core plastic plate that is coated with the ductile material.

14. A device comprising:
    a plastic housing comprising a plastic housing composition;
    a chip including an active top side and a rear side; and
    an interposer including a top side, edge sides and an underside opposing the top side, wherein the underside is secured on the active top side of the semiconductor chip, the edge sides are at least partially embedded into the plastic housing composition, the top side of the interposer includes a convex or concave lens-shaped top side fitting shape having a predetermined radius of curvature, at least part of the fitting shape being outside and not embedded within the plastic housing composition, and at least the convex or concave lens-shaped top side fitting shape of the interposer includes a coating of a ductile material;
        wherein the coating of at least the convex or concave lens-shaped top side fitting shape of the interposer comprises indium, and the indium is not combined with any other element to form an oxide.

* * * * *